(12) United States Patent
Endisch

(10) Patent No.: US 6,565,920 B1
(45) Date of Patent: May 20, 2003

(54) EDGE BEAD REMOVAL FOR SPIN-ON MATERIALS CONTAINING LOW VOLATILITY SOLVENTS FUSING CARBON DIOXIDE CLEANING

(75) Inventor: Denis H. Endisch, Cupertino, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/591,181

(22) Filed: Jun. 8, 2000

(51) Int. Cl.[7] .............................. B05D 3/12; B05D 1/02
(52) U.S. Cl. ....................... 427/240; 427/264; 427/271; 427/273; 427/287; 427/335; 427/425; 427/427; 134/7; 134/33; 134/34; 134/902; 438/759
(58) Field of Search ............................ 134/6, 7, 33, 34, 134/902; 427/240, 425, 427, 335, 261, 264, 266, 271, 273, 287; 438/694, 748, 759

(56) References Cited

U.S. PATENT DOCUMENTS

| | | | | |
|---|---|---|---|---|
| 4,510,176 A | * | 4/1985 | Cuthbert et al. ............... | 427/82 |
| 4,596,755 A | * | 6/1986 | Koike et al. ................. | 430/167 |
| 4,732,785 A | | 3/1988 | Brewer ........................ | 427/240 |
| 5,013,366 A | | 5/1991 | Jackson et al. ................ | 134/1 |
| 5,372,652 A | * | 12/1994 | Srikrishnan et al. ........... | 134/7 |
| 5,806,544 A | | 9/1998 | Kosic .......................... | 134/68 |
| 5,853,962 A | | 12/1998 | Bowers ........................ | 430/331 |
| 5,931,721 A | | 8/1999 | Rose et al. ................... | 451/89 |
| 5,961,732 A | * | 10/1999 | Patrin et al. ................. | 134/7 |
| 5,989,355 A | | 11/1999 | Brandt et al. ................. | 134/6 |
| 6,036,786 A | | 3/2000 | Becker et al. ................. | 134/2 |
| 6,042,994 A | | 3/2000 | Yang et al. ................... | 430/296 |
| 6,203,406 B1 | * | 3/2001 | Rose et al. .................... | 451/39 |
| 6,248,860 B1 | * | 6/2001 | Sant'Angelo et al. ........ | 528/196 |

OTHER PUBLICATIONS

Kosic, et al., "Carbon dioxide meets the challenges of precision cleaning", Solid State Technology, pp. S7–S8 and S10 (May 1998).

* cited by examiner

Primary Examiner—Shrive P. Beck
Assistant Examiner—Kirsten Crockford Jolley
(74) Attorney, Agent, or Firm—Rutan & Tucker, LLP; Sandra P. Thompson; Robert D. Fish

(57) ABSTRACT

Methods are provided for removing edge beads from spin-on films. A spin-on film is removed from a region of a surface of a spin-coated substrate adjacent to an edge of the surface by spinning the spin-coated substrate, expanding a fluid through a nozzle to form a cryogenic aerosol stream, and directing the cryogenic aerosol stream against the spin-on film in the region as the substrate spins. In another aspect of the invention, a film is formed on a surface of a substrate by dispensing a liquid composition onto the surface, spinning the substrate to distribute the liquid composition to form a substantially uniform film on the surface, expanding a fluid through a nozzle to form a cryogenic aerosol stream, and directing the cryogenic aerosol stream against the film in a region of the surface adjacent to an edge of the surface as the substrate spins. The film may include an alkoxysilane and a low volatility solvent. The fluid may consists essentially of liquid carbon dioxide. A spin-on film containing low volatility solvents does not grow back into the region from which the film was removed, the edge bead removal process time can be reduced to less than about 10 seconds, and the volume of waste solvent is reduced.

22 Claims, 2 Drawing Sheets

EDGE BEAD REMOVAL FOR SPIN-ON MATERIALS CONTAINING LOW VOLATILITY SOLVENTS FUSING CARBON DIOXIDE CLEANING

BACKGROUND

1. Field of the Invention

The invention relates to the production of integrated circuits. More particularly, the invention relates to the removal of edge beads of spin-on materials from substrates used in the production of integrated circuits.

2. Description of the Related Art

In the production of integrated circuits, several methods have been developed to deposit materials onto a substrate. One common method is spin-coating. Spin coating involves depositing a liquid composition onto a spinning substrate to thereby uniformly coat a surface of the substrate. Spin-coating is widely used in integrated circuit fabrication to deposit thin films of organic and inorganic dielectric materials onto substrates for use, for example, as photoresists, anti-reflection layers, intermetal dielectric layers, sacrificial layers, and passivation layers.

During the spin-coating process, the force exerted on the spinning liquid may cause an amount of the liquid to build up on the edge portion of the substrate forming an edge bead. Portions of the edge bead may detach from the substrate and become a source of particulate contamination during later process steps. Consequently, an area at the edge of the substrate and including the edge bead is typically cleared of coating material in an edge bead removal process during or after the spin-coating process.

In conventional edge bead removal processes, such as disclosed in U.S. Pat. No. 4,732,785, a stream of solvent is directed onto the substrate edge while the substrate is spinning. The solvent stream dissolves and removes a portion of the spin-on film including the edge bead.

Conventional edge bead removal processes suffer from several drawbacks. For example, when the substrate is a semiconductor wafer, conventional edge bead removal processes require a process time of about 5 seconds to about 20 seconds per wafer. A shorter process time would be advantageous. Moreover, the solvents used in conventional edge bead removal processes add to the volume of waste generated in the integrated circuit fabrication process.

In addition, conventional edge bead removal processes can produce unsatisfactory results if the spin-on material contains a solvent with low volatility. Typically, spin-on materials containing low volatility solvents, such as precursor compositions for low dielectric constant nanoporous silica films, are still liquid at the end of the spin-on process. In a conventional edge bead removal process, the solvent used to remove the edge bead is subsequently dried while the substrate is spinning. During the drying period, a spin-on film containing a low volatility solvent can spread back into the region from which the edge bead was removed. Consequently, the region from which spin-on material is removed must be sufficiently wide to compensate for spreading of the spin-on film. This reduces the usable surface area of the substrate.

What is needed is a rapid, environmentally benign edge bead removal process for use with spin-on materials containing low volatility solvents.

SUMMARY

Methods are provided for removing edge beads from spin-on films. A spin-on film is removed from a region of a surface of a spin-coated substrate adjacent to an edge of the surface by spinning the spin-coated substrate, expanding a fluid through a nozzle to form a cryogenic aerosol stream, and directing the cryogenic aerosol stream against the spin-on film in the edge region as the substrate spins. The film may include an alkoxysilane and a low volatility solvent.

In another aspect of the invention, a film is formed on a surface of a substrate by dispensing a liquid composition onto the surface, spinning the substrate to distribute the liquid composition to form a substantially uniform film on the surface, expanding a fluid through a nozzle to form a cryogenic aerosol stream, and directing the cryogenic aerosol stream against the film in a region of the surface adjacent to an edge of the surface as the substrate spins. The liquid composition may include at least one alkoxysilane and at least one solvent with a boiling point greater than about 175° C.

In one implementation, the fluid consists essentially of liquid carbon dioxide, and the cryogenic aerosol stream includes gaseous carbon dioxide and substantially solid carbon dioxide particles.

Advantageously, no high speed solvent spin-dry step is required during edge bead removal. Consequently, a spin-on film containing low volatility solvents does not grow back into the region from which the film was removed. Also, the edge bead removal process time can be reduced to less than about 10 seconds and a higher throughput cane achieved. Moreover, the volume of waste solvent is reduced and the integrated circuit manufacturing process is thereby made more environmentally friendly.

DETAILED DESCRIPTION

Figure 1B:
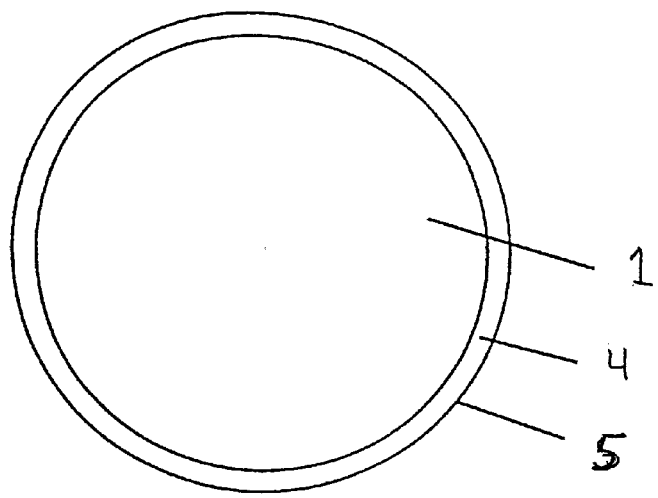
FIG. 1B shows a schematic top view of a spin-coated substrate.
Figure 1A:
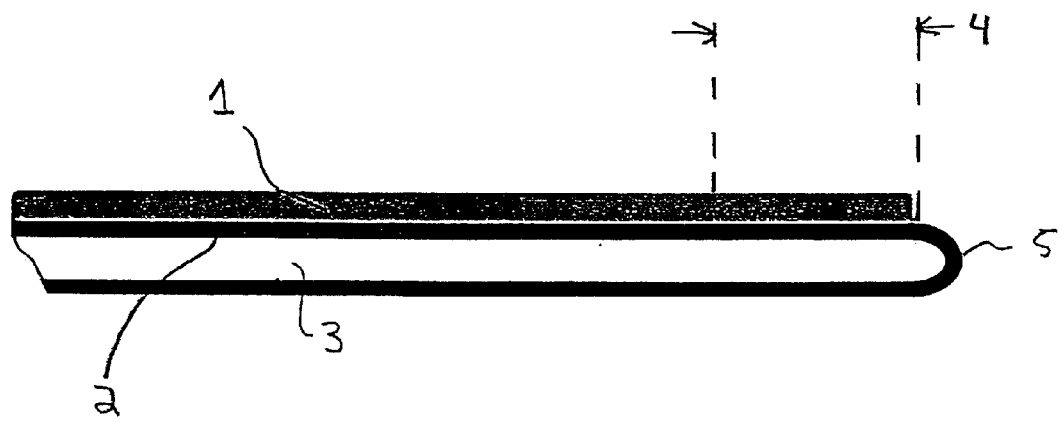
FIG. 1A shows a schematic representation of a cross-sectional view of a spin-coated substrate.

Referring to FIGS. 1A and 1B, in accordance with an embodiment of the present invention, a film 1 is spin-coated onto a surface 2 of a substrate 3. It should be noted that dimensions in FIGS. 1A and 1B are not to scale. Substrate 3 is typically much thicker than film 1.

Substrate 3 is typically a substrate suitable to be processed into an integrated circuit or other microelectronic device. Suitable substrates include but are not limited to wafers of semiconductor materials such as gallium arsenide, silicon, crystalline silicon, polysilicon, amorphous silicon, epitaxial silicon, and mixtures thereof. In one embodiment, surface 2 of substrate 3 includes a metal interconnect layer in an integrated circuit. Typically, metal interconnect layers contain conductive lines, conductive vias, and dielectric materials. Suitable conductive materials include but are not limited to aluminum, copper, tungsten, and mixtures thereof. In one embodiment, surface 2 of substrate 3 includes a dielectric layer in an integrated circuit. Suitable dielectric materials include but are not limited to conventional dielectric materials such as silicon oxide, silicon oxynitride, silicon nitride, and mixtures thereof, and low dielectric constant (low k) materials such as those listed below.

In one embodiment, film 1 is a film of a nanoporous silica precursor alkoxysilane composition to be subsequently polymerized or gelled and dried to produce a low dielectric constant nanoporous silica film. The present invention is independent of the type of nanoporous silica precursor composition used to form film 1. One example of a nanoporous silica precursor alkoxysilane composition, including an alkoxysilane, a low volatility solvent, and a high volatility solvent, is disclosed in U.S. Pat. No. 6,042,994 commonly assigned with the present application and incorporated herein by reference. Alkoxysilanes used in the example precursor composition include those which have the formula $SiR_4$, wherein at least 2 of the R groups are independently $C_1$ to $C_4$ alkoxy groups and the balance, if any, are independently selected from the group consisting of hydrogen, alkyl, phenyl, halogen, and substituted phenyl.

The high volatility solvent typically has a boiling point less than about 160° C. Suitable high volatility solvents include but are not limited to ethers such as anisole, esters such as ethyl-lactate, butyl acetate, propylene glycol ethyl ether acetate, propylene glycol methyl ether acetate, and propyl acetate, ketones such as acetone, cyclohexanone, 2-heptanone, and 3-pentanone, alcohols such as methanol, ethanol, n-propanol, isopropanol, and n-butanol, and mixtures thereof. The low volatility solvent typically has a boiling point above about 175° C. Suitable low volatility solvents include but are not limited to alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4-butanediol, 2-methyl-1,3-propanediol, tetraethylene glycol, triethylene glycol monomethyl ether, glycerol, and mixtures thereof.

The nanoporous silica precursor composition is deposited in a spin-coating process as follows. A quantity of the liquid nanoporous silica precursor composition is dispensed onto surface 2 at or near its center during a dispense cycle. In one embodiment, substrate 3 remains stationary during the dispense cycle, while in other embodiments substrate 3 rotates or spins at a relatively low speed, typically about 100 revolutions per minute (rpm) to about 1000 rpm for a wafer substrate 6–8 inches in diameter, during the dispense cycle. The dispense cycle is optionally followed by a short rest period and then by additional spins, hereinafter referred to as thickness spins, generally between approximately 1000 and 5000 rpm, although other spin speeds may be used, as appropriate. The liquid precursor composition is distributed during the thickness spins to form a substantially uniform film 1 on surface 2. Typically, the higher volatility solvent evaporates during the dispense cycle and the thickness spin, but the lower volatility solvent is still present in film 1 during and after the thickness spins.

In another embodiment, film 1 is a nanoporous silica gel formed by spin-coating a film of a nanoporous silica precursor composition onto surface 2, as described above, for example, and then polymerizing the film of precursor composition with an acid or base catalyzed hydrolysis reaction.

In other embodiments, film 1 is formed by spin-coating onto surface 2 a coating solution including a solvent and one or more low k insulating materials including but not limited to methylsiloxanes, phenylsiloxanes, methylphenylsiloxanes, methylsilsesquioxanes, methylphenylsilsesquioxanes, silicates, perhydrosilazanes, hydridosiloxanes and organohydridosiloxanes described by the general formula $(H_{0.4-1.0}SiO_{1.5-1.8})_n(R_{0.4-1.0}SiO_{1.5-1.8})_m$ wherein the sum of n and m is from about 8 to about 5000, polyimides, parylenes, fluorinated and non fluorinated poly (arylene ethers), polymeric material obtained from phenylethynylated aromatic monomers and oligomers, and mixtures thereof. In addition, film 1 can be formed by spin-coating low volatility polymer liquids such as polycarbosilane onto surface 2. The latter example does not require the use of solvents.

During or after a final portion of the spin process by which film 1 is formed on surface 2, a region 4 typically 2–4 millimeters in width and adjacent to an edge of surface 2 is cleared of spin-on material with an edge bead removal process utilizing a cryogenic aerosol. As is well known in the art, a cryogenic aerosol can be generated by rapidly expanding a fluid, i.e. a gas, liquid, or gas and liquid mixture, through a nozzle to form a gaseous stream including substantially solid particles and/or liquid particles. Typically, materials from which cryogenic aerosols are generated are liquid or gaseous at standard temperature and pressure.

Figure 2A:
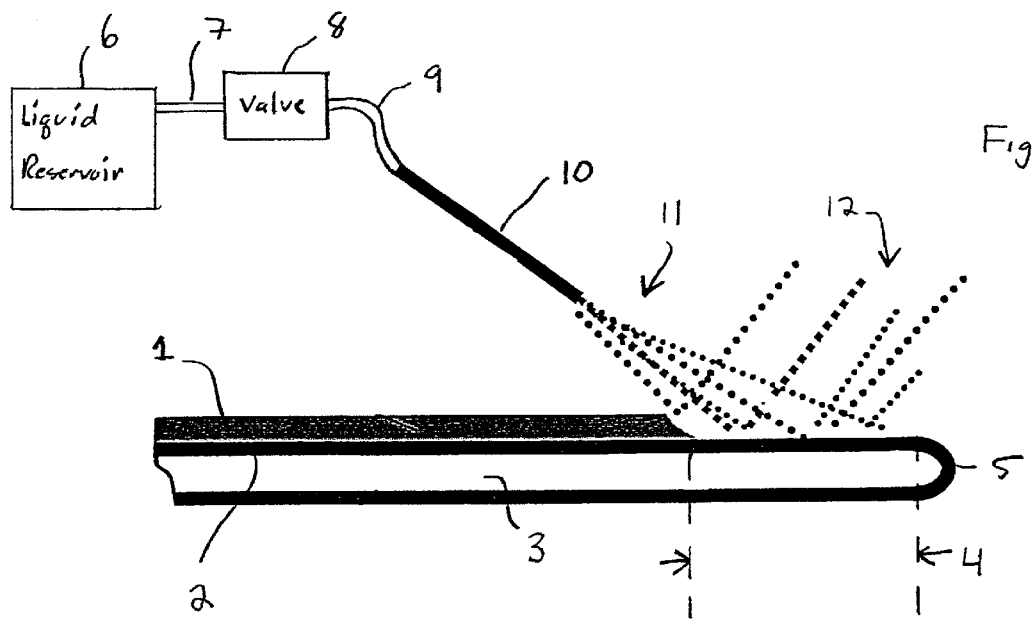
FIG. 2A shows a schematic representation, in cross-section, of a cryogenic aerosol stream removing a portion of a film from a spin-coated substrate according to an embodiment of the invention.
Figure 2B:
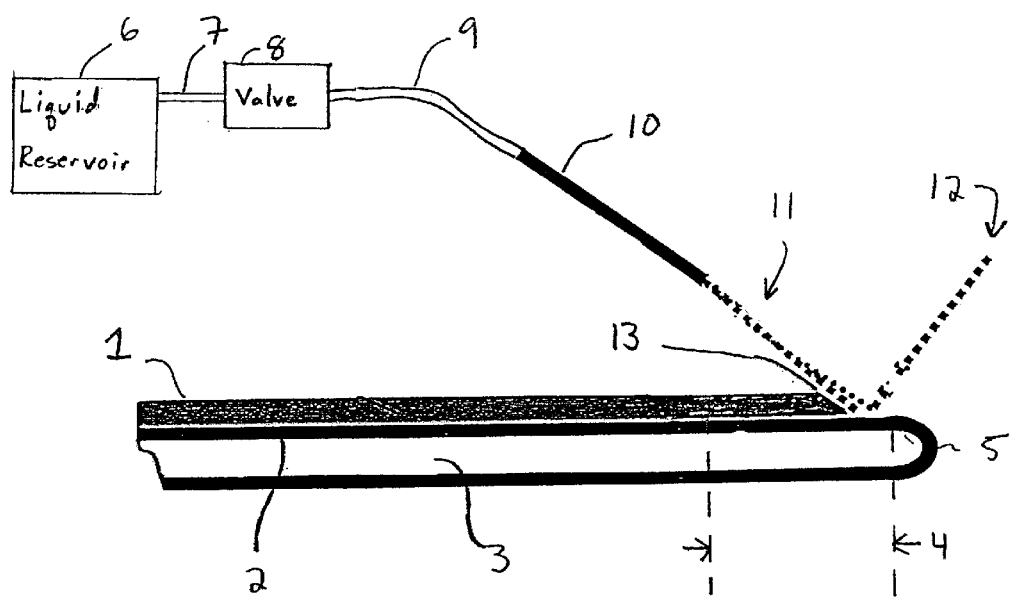
FIG. 2B shows a schematic representation, in cross-section, of a cryogenic aerosol stream removing a portion of a film from a spin-coated substrate according to another embodiment of the invention.

Referring to FIGS. 2A and 2B, in one embodiment liquid carbon dioxide stored in liquid reservoir 6 passes through tube 7, valve 8, and tube 9 and is expanded through nozzle 10 to form a fast moving cryogenic aerosol stream 11 of substantially solid carbon dioxide particles (hereinafter referred to as "carbon dioxide snow") and gaseous carbon dioxide. In one embodiment, stream 11 also includes liquid carbon dioxide. As substrates 3 spins, stream 11 is directed against and removes spin-on material from at least a portion of region 4. If film 1 is formed from a spin-on material containing low volatility solvents, substrate 3 typically spins at less than about 100 rpm to prevent regrowth of film 1 in region 4. Stream 11 is deflected by surface 2 to form deflected stream 12, which includes the removed material. Without being bound by theory, the inventor suggests that the impact of carbon dioxide snow particles in stream 11 removes the spin-on material from region 4 of surface 2. The removed material is then swept away by streams 11 and 12.

Advantageously, region 4 is cleared of spin-on material without the use of solvents. Also, the carbon dioxide snow evaporates quickly and leaves no liquid solvent residue. Consequently, no high speed solvent spin-dry step is required during edge bead removal, and a spin-on film of a low volatility liquid or a spin-on film containing low volatility solvents, such as a film of the nanoporous silica precursor composition described above, does not grow back into region 4. Moreover, the volume of waste solvent is reduced and the integrated circuit manufacturing process is thereby made more environmentally friendly. In addition, since the spin-dry step is eliminated during edge bead removal, the edge bead removal process time can be reduced to less than about 10 seconds and a higher throughput can be achieved.

In the embodiment illustrated in FIG. 2A, stream 11 is at least as wide at surface 2 as is region 4 to be cleared of spin-on material, and nozzle 10 is fixed in position with respect to edge 5 of substrate 3 to direct stream 11 against a portion of region 4 spanning the width of region 4. As substrate 3 spins, all portions of region 4 are exposed to stream 11 and cleared of spin-on material. Advantageously, region 4 can be cleared of spin-on material without moving nozzle 10 relative to edge 5 of substrate 3. Also, region 4 can be cleared of spin-on material in a single rotation of substrate 3.

In the embodiment illustrated in FIG. 2B, stream 11 is narrower at surface 2 than is region 4 to be cleared of spin-on material. As substrate 3 spins, nozzle 10 and substrate 3 are moved relative to each other to direct stream 11 against portions of region 4 at varying distances from edge 5 such that all portions of region 4 are exposed to stream 11 and cleared of spin-on material. Substrate 3 and nozzle 10 may be moved with respect to each other with a translation stage located beneath substrate 3, for example. Advantageously, edge 13 of film 1 forming an inner boundary of region 4 is sharply defined by a narrow stream 11.

In other embodiments, cryogenic aerosol stream 11 is generated from one or more materials including but not limited to carbon dioxide, nitrous oxide, ammonia, krypton, argon, methane, ethane, propane, butane, pentane, hexane, ethylene, propylene, tetrafluoromethane, chlorodifluoromethane, sulfur hexafluoride, perfluoropropane, and mixtures thereof.

During the cryogenic aerosol edge bead removal process, heat loss due to the interaction of cryogenic aerosol stream 11 with region 4 can cool substrate 3 and portions of film 1 outside of region 4. This cooling can cause moisture to condense on and possibly damage film 1. In one embodiment, a local heat source is provided to maintain substrate 3 and portions of film 1 outside of region 4 at a sufficient temperature to prevent substantial condensation of moisture onto film 1 during the edge bead removal process. The local heat source may be, for example, a radiant heat source such as a lamp or heating filament, or a stream of hot gas such as dry air or nitrogen. Use of the local heat source does not interfere with the removal of film 1 from region 4. Substantial condensation of moisture onto film 1 may also be prevented by controlling the ambient humidity with, for example, an environmental control system.

While the present invention is illustrated with particular embodiments, the invention is intended to include all variations and modifications falling within the scope of the appended claims.

I claim:

1. A method for removing a spin-on material from a region of a surface of a substrate, comprising:
   providing a substrate having a surface, wherein the surface is coated with a spin-on material that comprises an alkoxysilane silica precursor material and wherein the surface comprises an edge;
   spinning the substrate;
   expanding a fluid through a nozzle to form a cryogenic aerosol stream; and
   directing the cryogenic aerosol stream from the nozzle against the spin-on material in the region adjacent to the edge as the substrate spins.

2. The method of claim 1, wherein the cryogenic aerosol stream comprises a gas and substantially solid particles.

3. The method of claim 1, wherein the fluid comprises carbon dioxide, nitrous oxide, ammonia, krypton, argon, methane, ethane, propane, butane, pentane, hexane, ethylene, propylene, tetrafluoromethane, chlorodifluoromethane, sulfur hexafluoride, perfluoropropane, or mixtures thereof.

4. The method of claim 1, wherein the fluid comprises liquid carbon dioxide, and wherein the cryogenic aerosol stream comprises gaseous carbon dioxide and substantially solid carbon dioxide particles.

5. The method of claim 1, wherein a width of the cryogenic aerosol stream at the surface is greater than or equal to a width of the region.

6. The method of claim 1, wherein a width of the cryogenic aerosol stream at the surface is less than a width of the region, and wherein directing the cryogenic aerosol stream comprises moving the nozzle and the substrate relative to each other to expose portions of the region at varying distances from the edge to the cryogenic aerosol stream.

7. The method of claim 1, wherein the region includes an edge bead of the spin-on material.

8. The method of claim 1, wherein the spin-on material is a film.

9. The method of claim 1, wherein the spin-on material is a film.

10. The method of claim 1, wherein the region is up to 4 millimeters in width.

11. The method of claim 1, wherein the substrate comprises a semiconductor material.

12. The method of claim 1, further comprising heating the substrate and the spin-on material outside of the region to a temperature sufficient to prevent condensation of moisture onto the spin-on material.

13. The method of claim 1, wherein the spin-on material comprises a solvent having a boiling point above about 175° C.

14. The method of claim 1, wherein the alkoxysilane has the formula $SiR_4$, wherein at least 2 of the R groups are independently $C_1$ to $C_4$ alkoxy groups and the balance, if any, comprise hydrogen, alkyl, phenyl, halogen, or substituted phenyl.

15. The method of claim 13, wherein the solvent comprises ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4-butanediol, 2-methyl-1,3-propanediol, tetraethylene glycol, triethylene glycol monomethyl ether, glycerol, or mixtures thereof.

16. A method of forming a film on a surface of a substrate, the method comprising:
   dispensing a liquid composition onto the surface, wherein the liquid composition comprises at least one alkoxysilane silica precursor material;
   spinning the substrate, whereby the liquid composition is distributed to form a substantially uniform film on the surface;
   expanding a fluid through a nozzle to form a cryogenic aerosol stream; and
   directing the cryogenic aerosol stream from the nozzle against the film in a region of the surface adjacent to an edge of the surface as the substrate spins in order to remove the film from the region.

17. The method of claim 16, wherein the liquid composition comprises a solvent having a boiling point above about 175° C.

18. The method of claim 16, wherein the fluid comprises liquid carbon dioxide, and wherein the cryogenic aerosol stream comprises gaseous carbon dioxide and substantially solid carbon dioxide particles.

19. The method of claim 16, wherein a width of the cryogenic aerosol stream at the surface is greater than or equal to a width of the region.

20. The method of claim 16, wherein a width of the cryogenic aerosol stream at the surface is less than a width of the region, and wherein directing the cryogenic aerosol stream comprises moving the nozzle and the substrate relative to each other to expose portions of the region at varying distances from the edge to the cryogenic aerosol stream.

21. The method of claim 16, further comprising heating the substrate and the film outside of the region to a temperature sufficient to prevent condensation of moisture onto the film.

22. The method of claim 16, further comprising maintaining an ambient humidity and maintaining a temperature of the substrate and the film outside of the region sufficient to prevent condensation of moisture onto the film.

* * * * *